United States Patent [19]

Ono et al.

[11] Patent Number: 5,072,421
[45] Date of Patent: Dec. 10, 1991

[54] MAGNETIC MEMORY AND RECORDING-REPRODUCING METHOD FOR THE MAGNETIC MEMORY

[75] Inventors: Takeo Ono, Yokohama; Kou Yoneda, Kawasaki; Hitoshi Oda, Yokohama; Mamoru Miyawaki, Tokyo; Toyoshige Sasaki, Funabashi, all of Japan

[73] Assignee: Canon Kabushiki Kaisha, Tokyo, Japan

[21] Appl. No.: 593,252

[22] Filed: Oct. 1, 1990

Related U.S. Application Data

[63] Continuation of Ser. No. 257,130, Oct. 7, 1988, abandoned, which is a continuation of Ser. No. 883,921, Jul. 10, 1986, abandoned.

[30] Foreign Application Priority Data

Jul. 16, 1985 [JP] Japan ................................ 60-156623
Jul. 16, 1985 [JP] Japan ................................ 60-156624

[51] Int. Cl.$^5$ .............................................. G11C 11/14
[52] U.S. Cl. .......................................... 365/10; 365/11
[58] Field of Search ..................... 365/1, 10, 11, 122

[56] References Cited

U.S. PATENT DOCUMENTS

| | | | |
|---|---|---|---|
| 3,810,131 | 5/1974 | Ashkin et al. | 365/11 |
| 3,824,570 | 7/1974 | De Bot | 365/11 |
| 3,859,643 | 1/1975 | Borrelli | 365/10 |
| 3,990,037 | 11/1976 | Carlo | 365/10 |
| 4,153,328 | 5/1979 | Wang | 365/122 |
| 4,425,023 | 1/1984 | Matsumoto et al. | 350/96.14 |
| 4,575,179 | 3/1986 | Lee et al. | 350/96.13 |
| 4,583,200 | 4/1986 | Konishi et al. | 365/29 |

OTHER PUBLICATIONS

IBM Technical Disclosure Bulletin, vol. 16, No. 9 (Feb. 1974).
IEEE Transactions on Magnetics, vol. Mag-23, No. 3, pp. 1923-1927 (May 1987).
"Magneto-optical Readout of Magnetically Recorded Signals Using Magnetic Garnet Film", Trans. IECE Japan, vol. J67-C, pp. 871-878 (Nov. 84).
"Signal to Noise Ratio in Magneto-optic Transfer Readout With Magnetic Garnet Film", Trans. IECE Japan, vol. J68-C, pp. 216-223 (Mar. 85).
A. D. Fisher et al., "Optical Guided-Wave Interactions with Magnetostatic Waves at Microwave Frequencies", Naval Research Lab. Optical Sciences Div., Wash., D.C. (Aug. 1982).
C. S. Tsai et al., "Planar Guided-Wave Magneto Optic Diffraction by Magnetostatic Surface Waves in YIG/GGG Waveguides", Dept. of Elec. Engineering, Univ. of Calif.
Numata et al., "Magnetic Transcription and Magneto-Optical Reproducing Head Using Bi-Substituted Iron Garnet Films", vol. J62-C No. 11 (1979) (and English Translation).
Himuro et al., "A New Video Play-Back System Using a Magnetic Garnet Film", Sony Corp., ED79-26 (and English Translation).

Primary Examiner—Joseph A. Popek
Attorney, Agent, or Firm—Fitzpatrick, Cella, Harper & Scinto

[57] ABSTRACT

A magnetic memory has a substrate, a magnetic film provided on the substrate including a recording medium capable of producing a recording carrier, and a light waveguide layer on the magnetic film or on that surface of the substrate which is opposite to a surface on which the magnetic film is present. Recording and reproduction of information are effected relative to the magnetic film by a light propagated through the light waveguide layer.

33 Claims, 4 Drawing Sheets

MAGNETIC MEMORY AND RECORDING-REPRODUCING METHOD FOR THE MAGNETIC MEMORY

This application is a continuation of application Ser. No. 07/257,130 filed Oct. 7, 1988, now abandoned, which is a continuation of application Ser. No. 883,921 filed July 10, 1986, now abandoned.

BACKGROUND OF THE INVENTION

1. Field of the Invention

This invention relates to a magnetic memory, and in particular to a magnetic memory using magnetic bubbles, Bloch line, vertical magnetization or the like as a recording carrier, and to a recording-reproducing method for the magnetic memory.

2. Related Background Art

In a magnetic bubble memory or the like, to detect magnetic bubbles which are a recording carrier, use has heretofore been made of a stretcher which is constructed with a plurality of rows of patterns comprising Permalloy, like patterns for the transfer of magnetic bubbles, being increased successively in the direction of travel of magnetic bubbles, and by the effect of the pattern rows, the magnetic bubbles have been expanded to the same length as the width of the stretcher, and the enlarged magnetic bubbles have been detected by a magnetic resistance effect element or the like, whereby reproduction of information has been accomplished. Also, in a Bloch line memory, the presence or absence of a Bloch line is detected by being converted into the presence or absence of magnetic bubbles and therefore, a detection method similar to that in the above described magnetic bubble memory has been used.

However, in the above-described method, the signal voltage detected is proportional to the number of rows of the stretcher and therefore, the width (the number of rows) of the stretcher rows is detected by being enlarged to 500 to 800 times the diameter of the magnetic bubbles, and the size of the detecting portion for the magnetic bubbles is large, and to obtain a great signal voltage, it has been necessary to form the magnetic resistance effect element, the stretcher, etc. by complicated patterns and thus, a high-degree patterning technique has been required.

Accordingly, when the magnetic bubble memory or the Bloch line memory is to be made into a memory of higher density, it is cumbersome or difficult for the reason set forth above to make it and moreover, the pattern on the magnetic film thus made is very complicated and all circuits and elements for recording, reproduction and transfer cover the entire surface, and this may cause problems such as production of noise, which is turn may lead to a remarkable reduction in detection accuracy.

That is, to effect recording and reproduction at a high speed, there is a limit in the conventional memory structure or recording-reproducing system, and the need for magnetic memories capable of high-speed recording and reproduction is increasing.

SUMMARY OF THE INVENTION

In view of the above-noted problems peculiar to the prior art, it is an object of the present invention to provide a magnetic memory which is compact and simple in construction.

It is a further object of the present invention to provide a recording-reproducing method for a magnetic memory which is capable of accomplishing high-speed recording and reproduction by a simple construction.

To achieve the above objects, the magnetic memory according to the present invention has a substrate, a magnetic film provided on the substrate and comprising a recording medium capable of producing a recording carrier, and a light waveguide layer existing on the magnetic film or on that surface of the substrate which is opposite to a surface on which the magnetic film exists, the recording and reproduction of information being effected relative to the magnetic film by light propagated through the light waveguide layer.

Further features of the magnetic memory of the present invention and the details of a recording-reproducing method therefor are described in the embodiments shown below.

DESCRIPTION OF THE PREFERRED EMBODIMENTS

Figure 1:
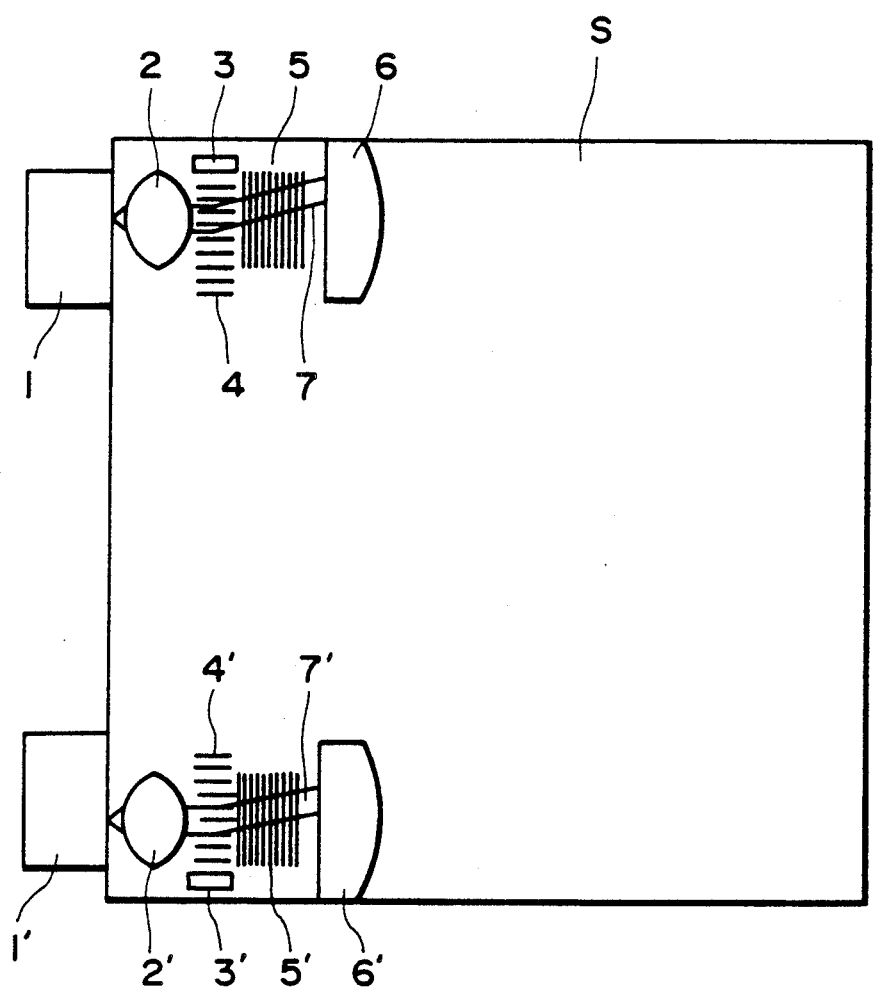
FIGS. 1 and 2 are schematic views showing an embodiment of the magnetic memory according to the present invention, FIG. 1 showing the bottom surface of the magnetic memory, and FIG. 2 showing the upper surface of the magnetic memory.
Figure 2:
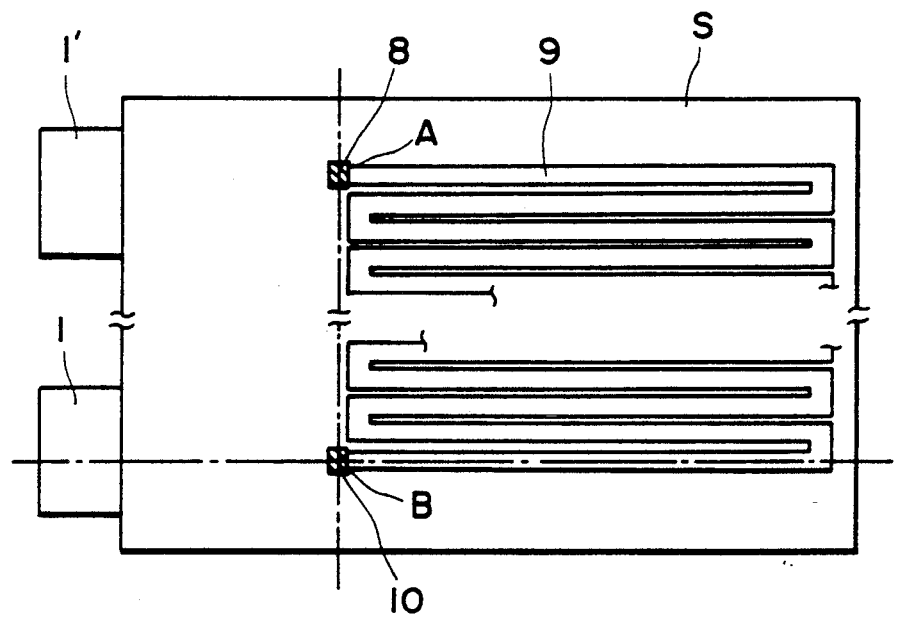
Figure 3A:
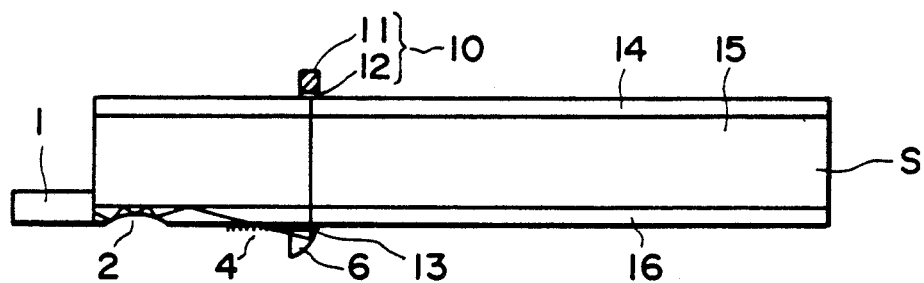
FIGS. 3A and 3B illustrate a recording-reproducing method for the magnetic memory shown in FIGS. 1 and 2, FIG. 3A being a side cross-sectional view, and FIG. 3B being a front cross-sectional view.
Figure 3B:
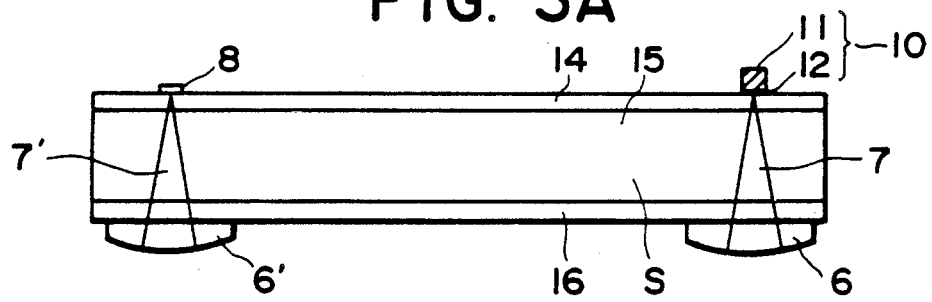

FIGS. 1 and 2 are schematic views showing an embodiment of the magnetic memory according to the present invention, FIG. 1 showing the bottom surface of the magnetic memory, and FIG. 2 showing the upper surface of the magnetic memory. FIGS. 3A and 3B illustrate a recording-reproducing method for the magnetic memory shown in FIGS. 1 and 2, FIG. 3A being a side cross-sectional view, and FIG. 3B being a front cross-sectional view. In FIGS. 1 to 4, letter S designates the magnetic memory according to the present embodiment, reference numerals 1 and 1' denote reading and writing semiconductor lasers, reference numerals 2 and 2' designate collimating Runeburg lenses, reference numerals 3 and 3' denote strip electrodes for producing static magnetic waves in a light waveguide layer 16, reference numerals 4 and 4' designate the static magnetic waves, reference numerals 5 and 5 denote grating couplers for taking out a laser light from the light waveguide layer 16, reference numerals 6 and 6' designate curved mirrors for reflecting and converging the laser light emitted from the light waveguide layer 16, reference numerals 7 and 7' denote the laser light diffracted by the static magnetic waves 4 and 4', reference numeral 8 designates the writing portion of a recording carrier (a magnetic bubble) formed with a light-absorbing film consisting of Sb, Te or the like, reference numeral 9 denotes an area in which a plurality of minor loops each consisting of a transferring pattern of the magnetic bubble are arranged, reference numeral 10 designates the reading-out portion of the recording carrier, reference numeral 11 denotes a photodiode, reference numeral 12 designates a polarizing plate, reference numeral 13 denotes a polarizing filter, reference numeral 14 designates a magnetic garnet film which is the recording carrier, reference numeral 15 denotes a substrate consisting of $Gd_3Ga_5O_{12}$, $Nd_3Ga_5O_{12}$ or the like, and reference numeral 16 designates the light waveguide layer comprising magnetic garnet or the like.

The magnetic memory S of the present invention is a memory using a magnetic bubble as a recording carrier, and the magnetic garnet film 14 is formed on the upper surface of the substrate 15, and the plurality of minor loops 9 each comprising a transferring pattern formed of Permalloy are arranged on the magnetic garnet film. These minor loops 9 are so formed as to be densest to increase the recording density. The writing portion 8 and the reading portion 10 are provided in the two end portions A and B, respectively, of each minor loop 9, the writing portion 8 has a light-absorbing film, and the reading portion 10 has the polarizing plate 12 and the photodiode 11. The light waveguide layer 16 is formed on the bottom surface of the substrate 15, i.e., the surface opposite to the surface of the recording carrier on which the magnetic garnet film 14 is formed, and the reading-out semiconductor laser 1 and the writing semiconductor laser 1' are provided on the end portion of the light waveguide layer 16. Also, the collimating Runeburg lenses 2,2' for collimating the laser lights emitted from the semiconductor lasers 1,1' and the grating couplers 5,5' for taking the laser light out of the light waveguide layer 16 are formed on the light waveguide layer 16 forward of the respective semiconductor lasers 1,1'. The curved mirrors 6.6' for reflecting the taken-out laser lights 7,7' in a direction perpendicular to the plane of the substrate 15 and for causing the laser lights to re-enter the memory are provided just beneath the reading-out portion 10 and the writing portion 8. Further, the strip electrodes 3,3' for producing the static magnetic waves 4,4' are provided in the light waveguide layer intermediate of the collimating Runeburg lenses 2,2' and the grating couplers 5,5'.

According to the present magnetic memory as shown in FIGS. 1 and 2, the system concerned in recording and reproduction is formed on the bottom surface different from the recording carrier, i.e., the surface on which the magnetic film and the magnetic memory is formed and thus, it is not necessary to form a complicated pattern on the surface of the magnetic film, i.e., the magnetic garnet film 14. Further, the present magnetic memory is a magnetic memory in which the optical recording-reproduction by laser light or the like is effected through the light waveguide layer 16 on the bottom surface and therefore, high speed recording and reproduction becomes possible. Also, as can be seen from FIGS. 1 and 2, it is possible to make the memory for recording and holding the recording carrier and the recording-reproducing system integral with each other and thus, a very compact magnetic memory device can be provided. Moreover, because the present device resorts to the optical system where complicated patterning is unnecessary and because the recording medium and the recording-reproducing system are separate from each other, it is apparent that the present device is a memory which has a reduced possibility of producing noise and other problems.

Examples of the material of the substrate applicable to the present invention and the materials forming the magnetic film and the light waveguide layer will be described.

As to the material of the substrate, there are various materials that can be used, depending on the kinds of the magnetic film and the recording carrier, but in a magnetic memory using a magnetic bubble or a Bloch line using as the recording carrier, mention may be made of $Nd_3Ga_5O_{12}$, $Sn_3Ga_5O_{12}$, $Gd_3Ga_5O_{12}$, $Dy_3Ga_5O_{12}$, etc.

As to the material of the magnetic film, there may be mentioned, in addition to magnetic garnet, heraferrite such as Fery magnetic material or $BaFe_{12}O_{19}$, and amorphous alloy film such as GdCo or GdCoMo.

Also, as to the material forming the light waveguide layer, mention may be made of $LiNbO_3$, $Y_3Fe_5O_{12}$, $Lu_3Fe_5O_{12}$, $Tb_3Fe_5O_{12}$, $(YBi) Fe_5O_{12}$, etc. and magnetic garnet.

The recording-reproducing method for the present magnetic memory will hereinafter be described in detail with reference to FIGS. 3A and 3B.

The laser light emitted from the semiconductor laser 1 located at an end of the back of the present magnetic memory S enters the light waveguide layer 16 and is collimated by the collimating Runeburg lens 2. By flowing a high-frequency alternating current to the strip electrode 3 and producing a static magnetic wave 4 in the light waveguide layer 16, the laser light emitted from the semiconductor laser 1 can be diffracted. Accordingly, the angle of diffraction of the laser light varies depending on the frequency of the high-frequency alternating current and therefore, the laser light can be deflected and scanned with the frequency being continuously changed. Subsequently, the laser light 7 deflected by the static magnetic wave 4 is once caused to emerge from the light waveguide 16 by the grating coupler 5, is reflected by the curved mirror 6 and again enters the magnetic memory S. The laser light which has again entered the magnetic memory S travels in a direction perpendicular to the bottom surface of the substrate 15 while being condensed, and is focused on the reading-out portion 10 of the magnetic garnet film 14 formed on the upper surface of the substrate 15. As shown in FIGS. 2 and 3, this focus position is a gate portion for taking out a magnetic bubble from the minor loop 9 and, in accordance with the presence or absence of the magnetic bubble at this position, the plane of polarization of the laser light transmitted through this position is varied (by the magneto-optical effect), and by the plate 12 and photodiode 11 provided on the magnetic garnet film 14, the presence or absence of the magnetic bubble is detected as a variation in the intensity of the detected light.

Where, for example, a magnetic bubble material of a magnetic bubble diameter of 1 $\mu m$ is used, if magnetic bubbles are arranged at intervals of 4 $\mu m$ on the reading-out portion 10 and the focal length of the curved mirror 6 is 5 mm, the scanning distance of the laser light 7 deflected by the static magnetic wave 4 is up to 520 $\mu m$. Accordingly, if the scanning frequency of the laser light and the transfer frequency of the magnetic bubble produced by the rotational magnetic field in the plane are 100 KHz, the bit rate of the reading-out will be about 13 Mbps and high-speed reproduction will become possible.

The recording of information, i.e., the writing of magnetic bubbles, can also be accomplished by a method substantially similar to the reading-out method. That is, the laser light is scanned by the static magnetic wave 4' and is condensed on the writing portion 8 of the magnetic garnet film 14 by the curved mirror 6'. Hereupon, the light-absorbing layer provided on the writing portion 8 generates heat, and the heat is applied to the magnetic garnet film 14 and the coercive force of this portion becomes small. Moreover, the leaking magnetic flux by the ambient magnetization is applied to this portion, whereby the magnetization is reversed and magnetic bubbles are formed. Also, as regards the bit rate of writing, 13 Mbps is possible under the same conditions as those in the case of the above-described writing-out and thus, high-speed recording becomes possible.

The magnetic memory of the present embodiment uses magnetic bubbles as the recording carrier and therefore, the transfer of the magnetic bubbles is accomplished by the rotational magnetic field in the plane, or the like. Also, it is necessary to apply a bias magnetic field perpendicularly to the substrate for the purpose of holding the magnetic bubbles.

As described above, in the magnetic memory of the present embodiment, a light waveguide layer is provided on the predetermined portion of the bottom surface of the substrate to waveguide the light therethrough, and this waveguided light is deflected and caused to pass through the substrate and is applied to the magnetic film to thereby effect recording or reproduction, and thus, high-speed recording or high-speed reproduction can be accomplished by a simple construction. That is, it is unnecessary that various members concerned in recording and reproduction be provided in a complicated manner only on the magnetic film, and the memory is constructed by the use of the upper and lower surfaces of the substrate.

Further, in the previously described embodiment, each one semiconductor laser is used for writing and reading-out, but if a plurality of semiconductor lasers are provided as a multiarray, the bit rate of writing and reading-out will be several times as great. Where, for example, ten lasers for writing are employed, if the scanning width is 500 $\mu$m and the bubble diameter is 1 $\mu$m as in the previous embodiment, there will be obtained a writing bit rate of 130 Mbps, and if the width of the light beam is 5.2 mm and the width of the photoelectric conversion element array is 5.2 mm, there can be obtained a reading out bit rate of 130 Mbps.

While the magnetic bubbles as the recording medium have hitherto been described, the present invention is not restricted thereto. Where, for example, a Block line is employed, means is provided for forming the minor loop in the magnetic bubbles by a stripe magnetic section and producing a pulse magnetic field in a direction perpendicular to the medium surface for the transfer of the Block line, whereby a memory of a construction substantially similar to the construction of the previous embodiment can be provided. Again in this case, unlike the heretofore proposed Bloch line memory, it is unnecessary to transfer the magnetic bubbles on the major line and therefore, the rotational magnetic field in the plane is unnecessary. Also, the interval between the magnetic bubbles may be of the same degree as the bubble diameter, and the recording density and the recording-reproducing speed are increased by about four times as compared with the conventional system.

In the above-described embodiment, a semiconductor laser is used as means for causing a light beam to enter the light waveguide and the semiconductor laser is brought into intimate contact with the end surface of the lower portion of the memory chip, whereas the light source which can be used is not limited to the semiconductor laser, but use may be made of any light source which can emit a light which can be deflected and can provide a waveguided light. As a further alternative, a light source may be provided at a location spaced apart from the end surface of the memory chip and light may be caused to enter the light waveguide layer through an optical system. Further, a grating coupler, a prism coupler or the like may be provided in the light waveguide layer and a light beam may be caused to enter the light waveguide layer from below the chip. The photodetector for reproduction need not always be provided on the magnetic film, but the light emerging from the magnetic film may be detected with the construction of the entire memory device taken into account. Further, to assist the magneto-optic effect during the production of the magnetic bubbles, a hairpin-like conductor or the like may be provided at the magnetic bubble writing position and a localized magnetic field may be applied thereto.

Also, in the above-described embodiment, the light waveguide layer is formed of magnetic garnet, but alternatively, it may be formed of such a material as LiNbO$_3$, and it is also possible to scan the light by the use of SAW (surface elastic wave). Further, as is naturally apparent, conversely to the above-described embodiment, a construction may be adopted in which the light waveguide layer is provided on the upper portion of the substrate and the magnetic film is provided on the lower portion of the substrate.

The arrangement configuration of the Permalloy patterns for transferring the magnetic bubbles shown in the embodiment of FIG. 2 is a mere example, and the arrangement configuration of such patterns may assume various configurations depending on the construction or the like of the memory chip. Accordingly, this also holds true of the arrangement of stripe magnetic sections in the Bloch line memory. Further, the memory chip itself may also of course assume various constructions without departing from the spirit of the present invention.

As described above, the magnetic memory according to the present invention is simple and compact and can accomplish recording and reproduction by a laser light or the like and thus, can accomplish high-speed recording and high-speed reproduction by a simple, stable system.

Figure 4:
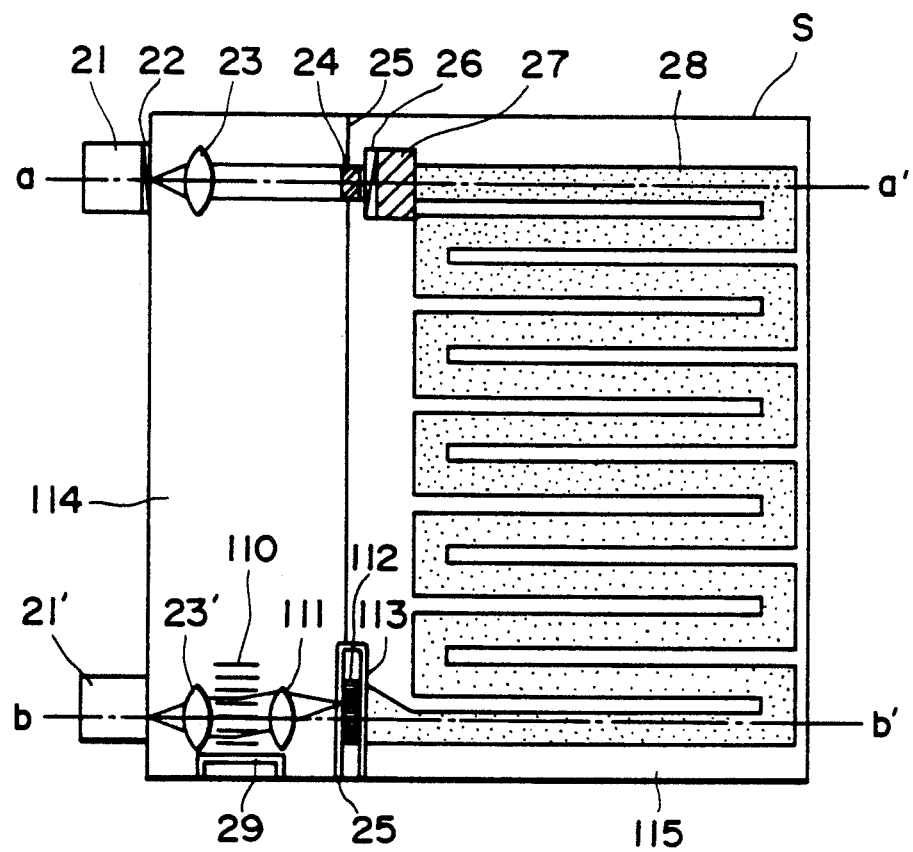
FIG. 4 is a schematic view showing another embodiment of the magnetic memory according to the present invention, and more particularly showing the upper surface of the magnetic memory.
Figure 5A:
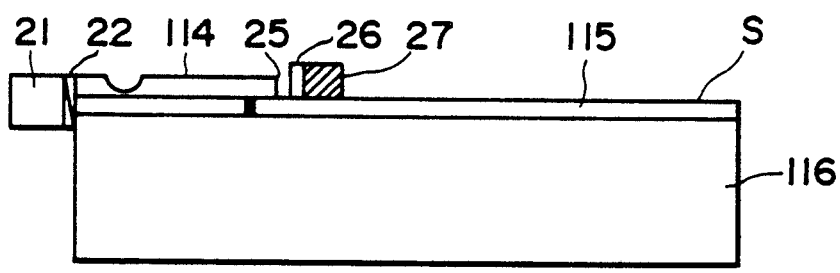
FIGS. 5A and 5B are cross-sectional views taken along lines a—a' and b—b', respectively, of FIG. 4.
Figure 5B:
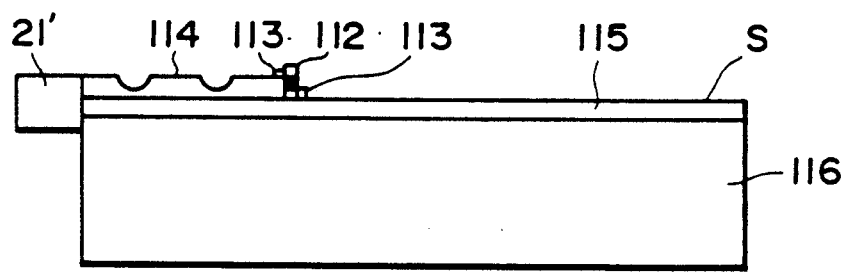
Figure 6:
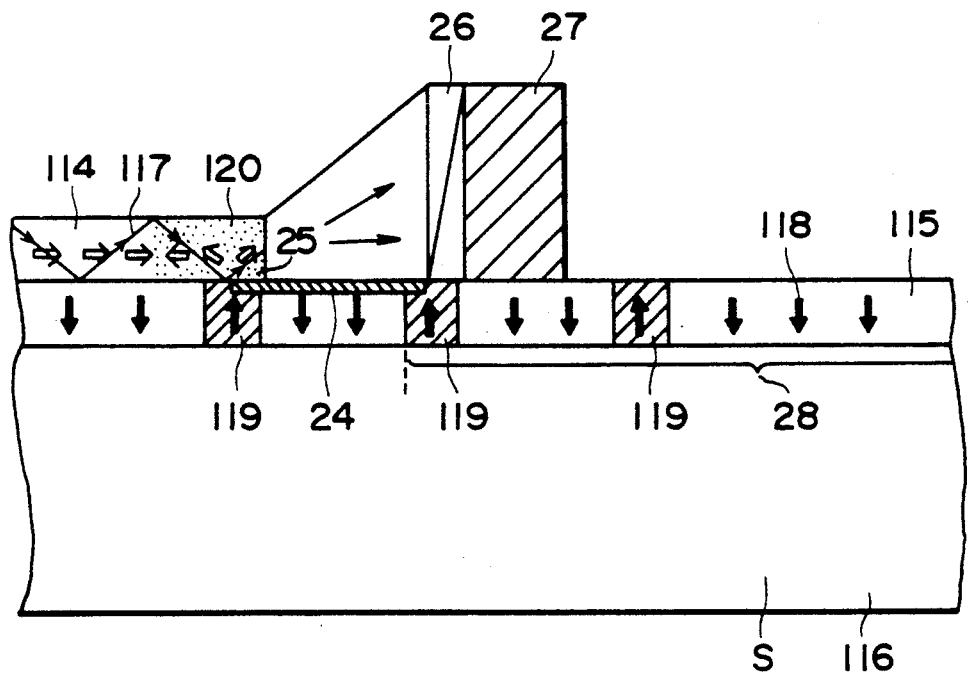
FIG. 6 illustrates an example of the reproducing method for the magnetic memory shown in FIG. 4.
Figure 7:
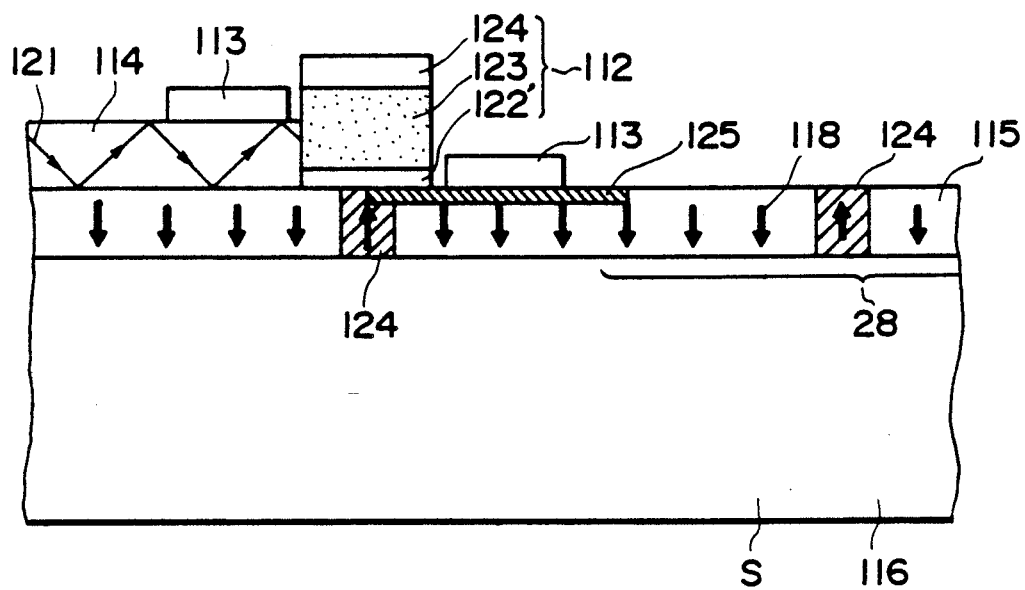
FIG. 7 illustrates an example of the recording method for the magnetic memory shown in FIG. 4.

FIG. 4 is a schematic view showing another embodiment of the magnetic memory according to the present invention. FIGS. 5A and 5B are cross-sectional views of the magnetic memory of FIG. 4 taken along lines a—a' and b—b', respectively, of FIG. 4, and FIGS. 6 and 7 illustrate the recording and reproducing method for the magnetic memory shown in FIG. 4. In FIGS. 4 to 7, letter S designates the magnetic memory, reference numerals 21 and 21' denote reading out and writing semiconductor lasers, respectively, reference numeral 22 designates a polarizer, reference numerals 23 and 23' denote collimating Runeburg lenses, reference numeral 24 designates a gate portion for taking out magnetic bubbles from a minor loop formed by a Permalloy pattern or the like, reference numeral 25 denotes the end surface of a light waveguide layer 114 comprising a magnetic garnet film, reference numeral 26 designates an analyzer, reference numeral 27 denotes photoelectric conversion elements, reference numeral 28 designates an area in which a plurality of minor loops exist reference numeral 29 denotes a strip electrode for producing a static magnetic wave, reference numeral 110 designates a static magnetic wave produced in the light waveguide layer, reference numeral 111 denotes a condensing Runeburg lens, reference numeral 112 designates a heat generating element having a photoconductive film, reference numeral 113 denotes a hairpin-like conductor pattern for producing an auxiliary pulse magnetic field for producing magnetic bubbles, reference numeral 114 designates a light waveguide layer comprising a magnetic garnet film having a readily magnetizable axis in the direction of travel of light, reference numeral 115 denotes a magnetic garnet film which is a recording medium forming the magnetic bubbles, reference numeral 116 designates a substrate formed of non-magnetic garnet such as $Nd_3Ga_5O_{12}$, $Sm_3Ga_5O_{12}$, $Gd_3Ga_5O_{12}$ or $Dy_3Ga_5O_{12}$, reference numerals 117 and 121 denote laser lights propagated through the light waveguide layer 114, reference 118 designates arrows indicating the direction of magnetization in the magnetic film, reference numerals 119 and 124 denote magnetic bubbles, reference numeral 120 designates an area in the light waveguide layer 114 in which the direction of magnetization has been changed by the magnetic bubbles 119, reference numerals 122 and 122' denote electrodes for applying a voltage to a photoconductive film, reference numeral 123 designates a photoconductive film, and reference numeral 125 denotes a gate portion for transferring the magnetic bubbles 124 to the minor loops 28.

The memory applied in the present embodiment is a memory using magnetic bubbles as a recording carrier, and the magnetic garnet film 115 is formed on the nonmagnetic garnet substrate 116 by the liquid phase growing method or the like. A plurality of magnetic bubble transferring minor loops each comprising a Permalloy pattern, an ion-introduced layer, etc. are formed on a part of the magnetic garnet film 115, and the light waveguide layer 114 comprising a magnetic garnet film is formed on a predetermined portion except the area 28 in which said plurality of minor loops exist, and a bias magnetic field is applied in the direction of travel of light. Further, the reading-out semiconductor laser 21 and the writing semiconductor laser 21' are attached to the end surface of the light waveguide layer, the polarizer 22 for determining the plane of polarization of the laser light is disposed on the front face of the reading-out semiconductor laser 21, and the collimating Runeburg lens 23 for collimating the light emitted from the reading-out semiconductor laser 21 is provided on a portion of the light waveguide layer 114. On the end surface 25 of the light waveguide layer 114 which is in the direction of travel of the laser light propagated through the collimating Runeburg lens 23, there is the gate portion 24 for taking out the magnetic bubbles from the minor loops 28, and there is also provided a magnetic bubble detecting system comprising the analyzer 26 and the photoelectric conversion elements 27. On the other hand, the collimating Runeburg lens 23' for collimating the laser light and the condensing Runeburg lens 111 are disposed forwardly of the writing semiconductor laser 21, and a magnetic bubble producing portion comprising the heat generating element 112 having a photoconductive film and the hairpin-like conductor pattern 113 for producing an auxiliary pulse magnetic field is disposed on the end surface of the light waveguide layer 114 which is the position at which the laser light is condensed by the condensing Runeburg lens 111. The strip electrode 29 for producing a static magnetic wave is provided between and adjacent to the collimating Runeburg lens 23' and the condensing Runeburg lens 111.

A magnetic garnet such as $Y_3Fe_5O_{12}$, $Lu_3Fe_5O_{12}$, $Tb_3Fe_5O_{12}$, $(YBi)_3Fe_5O_{12}$ or the like is suitable for the film having the magnetic transfer function and the light beam waveguide function which is used in the present embodiment.

In the magnetic memory shown in FIG. 4, the light waveguide layer is provided on a predetermined portion on the magnetic garnet film 115 so that the writing and/or reading-out of magnetic bubbles is effected by the light beam passed through the light waveguide layer and therefore, it is not necessary to form a complicated pattern such as a stretcher on the magnetic garnet film as in the conventional magnetic bubble memory, and thus, the magnetic memory of FIG. 4 is easy to manufacture and simple in construction. Further, a magnetic memory device in which devices such as semiconductor lasers and photoelectric conversion elements can be formed integrally with each other and recording and reproduction of information can be accomplished and which is compact can be provided. Of course, according to the magnetic memory of the present invention, optical recording and reproduction using a laser light or the like can be accomplished and therefore, it is possible to accomplish high-speed recording and high-speed reproduction.

The recording-reproducing method will hereinafter be described in detail.

The reproducing method in the magnetic memory of the present embodiment will hereinafter be described in detail with reference to FIG. 6. The magnetic bubbles 119 are transferred from the minor loops 28 to the end portion 25 of the light waveguide layer 114 through the gate portion 24. As regards the magnetization of the light waveguide layer 114 on the magnetic bubbles 119, reversal of the magnetization partly occurs in the direction of the readily magnetizable axis under the influence of the leaking magnetic flux from the magnetic bubbles 119. At this time, the laser light 117 propagated through the light waveguide layer 114 has its plane of polarization rotated in the direction opposite to the other portion when it passes through the portion in which the reversal of the magnetization is occurring. Accordingly, the laser light emerging from the light waveguide layer 114 is detected by the photoelectric conversion element 27 through the analyzer 26, whereby the deviation of the plane of polarization can be converted into the difference in the quantity of transmitted light at the analyzer 26 and read out and the presence or absence of the magnetic bubbles 119 can be detected as an electrical signal.

The recording method in the magnetic memory of the present embodiment will now be described in detail with reference to FIGS. 4 and 7. The emergent light from the writing semiconductor laser 21' enters the light waveguide layer 114 and is collimated by the collimating Runeburg lens 23'. This collimated light beam is diffracted by the static magnetic wave 110 produced by the strip electrode 29 and enters the condensing Runeburg lens 111. The angle of diffraction of the collimated light beam depends on the frequency of an alternating current flowing to the strip electrode 29 and therefore, by continuously varying the frequency of this alternating current, the collimated light beam can be deflected and scanned. That is, the laser light 121 passed through the condensing Runeburg lens 111 is condensed as a spot of a diameter of about 2 μm on the photoconductive film 123 and scanned. The portion having the photoconductive film 123 to which the laser light 121 has been applied generates heat due to an electric current flowing therethrough, and the temperature of the magnetic garnet film 115 located under the portion which has generated heat rises and reversal of the magnetization is caused by the magneto-optical effect, whereby magnetic bubbles 124 are formed. At this time, in order to assist in the formation of the magnetic bubbles 124, it is preferable to flow an electric current to the hairpin-like conductor pattern 113 and locally apply a bias magnetic field thereto. That is, by modulating the intensity of the laser light 121 during the spot scanning of the laser light 121 and applying a bias magnetic field in synchronism therewith, a plurality of magnetic bubbles 124 corresponding to the recording information can be produced in one scan of the laser light 121.

For example, if the range of the frequency of the static magnetic wave 110 produced by the strip electrode 29 is from 3.61 GHz to 4.66 GHz, the angle of deviation of the laser light 121 is 6°, and if the focal length of the condensing Runeburg lens 111 is 5 mm, the scanning distance of the laser light 121 is 520 μm. If at this time, a magnetic garnet of bubble diameter 1 μm is used as a medium, magnetic bubbles 124 of a diameter of 1 μm can be written at intervals of 4 μm, and maximum 130 magnetic bubbles 124 can be produced by one scan of the laser light 121. If the frquency of the magnetic bubble transferring rotational magnetic field in the plane within the minor loops 28 is 100 KHz, a writing bit rate of about 13 Mbps will be obtained with the scanning frequency of the laser light 121 being also adjusted to 100 KHz. Also, in the reading-out, the number of rows of the minor loops 28 is 130 and, since the magnetic bubbles are transferred at 100 KHz, the reading-out bit rate of 13 Mbps is possible.

As described above, in the magnetic memory applied in the present embodiment, a light waveguide layer is provided on a predetermined portion on the magnetic film and the magnetization of the signal of the recording carrier (magnetic bubbles) in the magnetic film is transferred to the light waveguide layer to thereby effect reproduction of the record and thus, high-speed reproduction can be accomplished by a very simple construction.

Also, in the reproduction as well as in the writing, the light beam from the reading-out laser may be deflected by a static magnetic wave, and a plurality of magnetic bubbles transferred from the minor loops through the gate portion may be individually detected. In this case, a condensing Runeburg lens, together with a collimating Runeburg lens, is provided in the light waveguide so that the condensed position by the condensing Runeburg lens coincides with the detected position of the magnetic bubbles. The laser light emerging from the light waveguide layer can be detected by a detecting system similar to that in the previous embodiment. In this method, the laser light is condensed and therefore, the entire light beam is subjected to a variation in magnetization, whereby the S/N ratio can be improved and cross-talk or the like can be decreased. The laser light emerging from the light waveguide layer becomes a divergent light beam and therefore, actually, construction must be made with the spacing between the end surface of the light waveguide layer and the photoelectric conversion element being well taken into account.

Further, in the previously described embodiment, each one semiconductor laser is used for writing and reading-out, but if a plurality of semiconductor lasers are provided as a multiarray, the bit rates of writing and reading-out will be several times as great. For example, where ten writing lasers are used, if the scanning width is 500 μm and the bubble diameter is 1 μm as in the previously described embodiment, there will be obtained a writing bit rate of 130 Mbps, and if regarding the reading-out, the width of the light beam is 5.2 mm and the width of the photoelectric conversion element array is 5.2 mm, there can be obtained a reading-out bit rate of 130 Mbps.

While the magnetic bubbles have been described as the recording medium, the present embodiment is neither restricted thereto. For example, where a Bloch line is employed, means may be provided for forming the minor loops in the magnetic bubbles by stripe magnetic sections and producing a pulse magnetic field in a direction perpendicular to the medium surface for the purpose of transferring the Bloch line, whereby a memory substantially similar in construction to the embodiment of FIG. 4 can be realized. In this case, unlike the heretofore proposed Bloch line memory, it is unnecessary to transfer the magnetic bubbles on the major line and therefore, the rotational magnetic field in the plane is unnecessary. Also, the spacing between the magnetic bubbles may be of the same degree as the bubble diameter, and the recording density and the recording-reproducing speed are increased by about four times as compared with the conventional system.

In the above-described embodiment, a semiconductor laser is used as the means for causing a light beam to enter the light waveguide and this semiconductor laser is brought into intimate contact with the end surface of the memory chip, whereas the light source which can be used is not limited to a semiconductor laser as in the embodiment of FIG. 1, and the light source may be provided at a location spaced apart from the end surface of the memory chip so that light may enter the light waveguide layer through an optical system. Further, a grating coupler, a prism coupler or the like may be provided on the light waveguide layer and a light beam may be caused to enter the light waveguide layer from above the chip. Also, where the waveguided light whose state has been varied, that is, whose plane of polarization has been rotated, in accordance with the transferred signal magnetization, is to be detected, it is also possible to cause the waveguided light to once emerge into the air by a grating coupler, a prism coupler or the like and detect the waveguided light by a detector installed at a predetermined location, besides the method of providing detecting means on the memory chip as in the above-described embodiment.

According to the magnetic memory described above with reference to FIGS. 1 to 7, a light waveguide layer is formed on the magnetic film on which the recording carrier exists, or on the opposite side (the bottom surface) from the magnetic film through the substrate, and by the light propagated through the light waveguide layer, recording and/or reproduction of information can be accomplished by the use of, for example, the magneto-optical effect or the Faraday effect. The area in which the light waveguide layer is formed may be suitably determined with the positions of the substantial recording area in which the minor loops, etc. exist, the reading-out portion (the reproducing portion) and the writing portion (the recording portion), and the light waveguide layer need not always be formed on the whole surface of the substrate. Also, according to the above-described embodiments, the minor loop which holds the recording carrier such as magnetic bubbles and serves also as the transfer path is a continuous single loop, but for example, a plurality of minor loops may be formed and writing portions and reading portions may be disposed in the individual minor loops.

We claim:

1. A magnetic bubble producing apparatus for producing a magnetic bubble in a magnetic film provided on one surface of a substrate, comprising:
   a lightwave guide layer provided on at least part of the other opposite surface of the substrate;
   means for causing a light beam to enter said light waveguide layer; and
   means for directing the light beam, which enters said light waveguide layer and propagates therethrough, to the magnetic film through the substrate so that a magnetic bubble is produced in the magnetic film by the light beam directed to the magnetic film.

2. An apparatus according to claim 1 further comprising scanning means for scanning the light beam propagated through said light waveguide layer in a predetermined direction.

3. An apparatus according to claim 1, further comprising a light-absorbing member formed on said magnetic film, wherein said light-absorbing member absorbs the light beam to generate heat, thereby producing the magnetic bubble in said magnetic film.

4. An apparatus according to claim 1, wherein said causing means includes a semiconductor laser and the light beam is supplied from said semiconductor laser.

5. An apparatus according to claim 4, wherein said laser is securely attached to an end surface of the substrate.

6. A magnetic bubble detecting apparatus for detecting a magnetic bubble in a magnetic film provided on one surface of a substrate, comprising:
   a thin film waveguide layer provided on at least part of the other surface of the substrate;
   means for generating a light beam;
   means for directing the light beam, which enters said thin film waveguide layer and propagates therethrough along the other surface, to the magnetic film through the substrate; and
   means for detecting the state of the plane of polarization of the light beam passing through the magnetic film thereby detecting whether a magnetic bubble is in the magnetic film.

7. An apparatus according to claim 6, further comprising scanning means for scanning the light beam propagated through said light waveguide layer in a predetermined direction.

8. An apparatus according to claim 6, wherein said directing means includes means for taking out the light beam from said light waveguide layer and reflecting means for reflecting the light beam from said light waveguide layer to said substrate.

9. An apparatus according to claim 6, wherein said generating means includes a semiconductor laser and the light beam is supplied from said semiconductor laser.

10. An apparatus according to claim 9, wherein said laser is securely attached to an end surface of the substrate.

11. An apparatus according to claim 6, wherein said detecting means includes a polarization plate and a photodetector.

12. A method for producing a magnetic bubble in a magnetic film provided on a substrate having a light waveguide layer and a light absorbing member on the magnetic film, said method comprising the steps of:
   directing a light beam to the light waveguide layer to be propagated therethrough;
   causing the propagated light beam to enter the light absorbing member to heat the light absorbing member; and
   producing a magnetic bubble in a portion of the magnetic film near the light absorbing member.

13. A method for detecting a magnetic bubble in a magnetic film provided on a substrate having a light waveguide layer on the magnetic film, said method comprising the steps of:
   directing a light beam to the light waveguide layer to be propagated therethrough;
   scanning the propagated light beam in a predetermined direction; and
   detecting the state of the plane of polarization of the propagated light beam for detecting a magnetic bubble existing along the predetermined direction.

14. A method for producing a magnetic bubble in a magnetic film, said method comprising the steps of:
   providing a substrate having the magnetic film disposed on one surface thereon and a light waveguide layer on the opposite surface thereof, and providing a light absorbing member on the magnetic film;
   directing a light beam to the light waveguide layer to be propagated therethrough;
   causing the propagated light beam to enter the light absorbing member through the substrate to heat the absorbing member; and
   producing a magnetic bubble in the magnetic film under the light absorbing member.

15. A method for detecting a magnetic bubble in a magnetic film formed on a predetermined surface of a substrate, said method comprising the steps of:
   providing a thin film waveguide layer on a surface of the substrate other than the predetermined surface on which the magnetic film is formed;
   directing a light beam to the thin film waveguide layer to be propagated therethrough along the other surface;
   causing the propagated light beam to enter the magnetic film through the substrate; and
   detecting the state of the plane of polarization of the light beam passing through the magnetic film to detect the existence of a magnetic bubble in the magnetic film.

16. A method according to claim 15, further comprising the step of scanning the propagated light beam in a predetermined direction so that the existence of the magnetic bubble in the predetermined direction in the magnetic film is detected.

17. A method for producing a magnetic bubble in a magnetic film provided on a substrate, having a light waveguide layer, said method comprising the steps of:
   directing a light beam to the light waveguide layer to be propagated therethrough;

condensing the propagated light beam in the vicinity of the magnetic film to heat the magnetic film to produce;

a magnetic bubble in the magnetic film.

18. A method according to claim 17, further comprising a step of scanning the propagated light beam, thereby producing magnetic bubbles at different positions in the magnetic film.

19. A magnetic bubble detecting apparatus for detecting a magnetic bubble in a magnetic film provided on a substrate having a light waveguide layer, comprising:

means for directing a light beam to the light waveguide layer for causing the light beam to propagate therein;

means for scanning the light beam propagating in the light waveguide layer in a predetermined direction; and means for detecting the state of the polarization plane of said propagating light beam in order to detect the magnetic bubble existing along said predetermined direction.

20. An apparatus according to claim 19, wherein said directing means has a semiconductor layer and the light beam from said semiconductor laser is directed to the light waveguide layer.

21. An apparatus according to claim 20, wherein said laser is securely attached to the substrate.

22. An apparatus according to claim 19, wherein said predetermined direction is provided in a direction along which a magnetic bubble transfer pattern formed on the substrate is arranged.

23. An apparatus according to claim 18, wherein said scanning means includes means for generating a surface elastic wave in the light waveguide layer in such a manner that the propagation direction of said surface elastic wave crosses that of the light beam.

24. An apparatus according to claim 18, wherein said detecting means includes a polarization plate and a photodetector.

25. A magnetic bubble producing apparatus for producing a magnetic bubble in a magnetic film provided on a substrate having a light waveguide layer, comprising:

means for directing a light beam to the light waveguide layer to cause the light beam to propagate therein; and means for condensing said propagating light beam in the vicinity of the magnetic film so as to heat the magnetic film in order to produce the magnetic bubble in the magnetic film.

26. An apparatus according to claim 25, wherein said directing means has a semiconductor laser and the light beam from said semiconductor laser is directed to the light waveguide layer.

27. An apparatus according to claim 26, wherein said laser is securely attached to the substrate.

28. An apparatus according to claim 25, wherein a light absorbing layer is provided on the substrate, said condensing means condenses the light beam to the light absorbing layer such that the light absorbing layer heats a predetermined portion of the magnetic film.

29. An apparatus according to claim 28, wherein the light waveguide layer and the light absorbing layer are provided on the magnetic film.

30. An apparatus according to claim 28, wherein the light absorbing layer is provided on the magnetic layer and the light waveguide layer and said condensing means are provided on a surface of the substrate opposite to that where the magnetic film is provided.

31. An apparatus according to claim 25, further comprising means for scanning said propagating light beam in a predetermined direction.

32. An apparatus according to claim 31, wherein said scanning means includes means for generating a surface elastic wave in the light waveguide layer in such a manner that the propagation direction of said surface elastic wave crosses that of the light beam.

33. A method for producing a magnetic bubble in a magnetic film provided on a predetermined surface of a substrate having a light waveguide, comprising the steps of:

directing a light beam to the light waveguide to be propagated therethrough; and producing the magnetic bubble by heating the magnetic film from the action of the propagated light.

* * * * *

UNITED STATES PATENT AND TRADEMARK OFFICE
CERTIFICATE OF CORRECTION

PATENT NO. : 5,072,421

DATED : December 10, 1991

INVENTOR(S) : Takeo Ono, et al.

It is certified that error appears in the above-identified patent and that said Letters Patent is hereby corrected as shown below:

COLUMN 2:

Line 59, "reference numerals 5 and 5" should read --reference numerals 5 and 5'--.

COLUMN 3:

Line 38, "curved mirrors 6.6'" should read --curved mirrors 6, 6'--.

COLUMN 13:

Line 3, "produce;" should read --produce--.

Line 23, "semiconductor layer" should read --semiconductor laser--.

Line 32, "claim 18," should read --claim 19,--.

UNITED STATES PATENT AND TRADEMARK OFFICE
CERTIFICATE OF CORRECTION

PATENT NO. : 5,072,421

DATED : December 10, 1991

INVENTOR(S) : Takeo Ono, et al.

It is certified that error appears in the above-identified patent and that said Letters Patent is hereby corrected as shown below:

Column 13, line 37, "claim 18," should read --claim 19,--.

Signed and Sealed this

Twenty-fifth Day of May, 1993

Attest:

MICHAEL K. KIRK

Attesting Officer

Acting Commissioner of Patents and Trademarks